(12) United States Patent
Wu et al.

(10) Patent No.: US 12,134,727 B2
(45) Date of Patent: Nov. 5, 2024

(54) COMPOSITE PHASE CHANGE MATERIAL, APPLICATION METHOD OF COMPOSITE PHASE CHANGE MATERIAL, AND BATTERY

(71) Applicant: DONGGUAN NVT TECHNOLOGY LIMITED, Dongguan (CN)

(72) Inventors: Hao Wu, Dongguan (CN); Yongzhen Wang, Dongguan (CN); Xiaoxi Liu, Dongguan (CN); Binglong Yin, Dongguan (CN)

(73) Assignee: DONGGUAN NVT TECHNOLOGY LIMITED, Guangdong (CN)

( * ) Notice: Subject to any disclaimer, the term of this patent is extended or adjusted under 35 U.S.C. 154(b) by 791 days.

(21) Appl. No.: 17/218,094

(22) Filed: Mar. 30, 2021

(65) Prior Publication Data
US 2021/0403781 A1    Dec. 30, 2021

(30) Foreign Application Priority Data
Jun. 30, 2020  (CN) .......................... 202010623183.8

(51) Int. Cl.
*C09K 5/06*    (2006.01)
*C08F 20/06*    (2006.01)
(Continued)

(52) U.S. Cl.
CPC ................ *C09K 5/06* (2013.01); *C08F 20/06* (2013.01); *C08K 5/053* (2013.01); *C08K 5/06* (2013.01);
(Continued)

(58) Field of Classification Search
CPC ................ C08F 20/06; C08F 220/1808; C08F 220/1811; C08F 220/20; C08F 220/281;
(Continued)

(56) References Cited

U.S. PATENT DOCUMENTS

2009/0274906 A1    11/2009   Schwantes
2012/0302695 A1    11/2012   Osae et al.
(Continued)

FOREIGN PATENT DOCUMENTS

CN    1357591 A    7/2002
CN    101567472 A    10/2009
(Continued)

OTHER PUBLICATIONS

Machine translation of JP 2006-063314, Amano et al; Mar. 9, 2006 (Year: 2006).*
(Continued)

*Primary Examiner* — Frances Tischler
(74) *Attorney, Agent, or Firm* — Morgan, Lewis & Bockius LLP (57) ABSTRACT

A composite phase change material, including 65 to 80 parts of a phase change material and 20 to 35 parts of a binder by weight. The binder includes an acrylate monomer having a molecular weight of 50 to 300, an acrylate polymer having a molecular weight of 500 to 2000, and an initiator. The initiator in the composite phase change material can generate free radicals under the condition of ultraviolet light irradiation to initiate polymerization reactions between components of the composite phase change material, so that the composite phase change material is cured, thereby greatly accelerating a cure speed of the composite phase change material.

18 Claims, 3 Drawing Sheets

(51) Int. Cl.
C08K 5/053 (2006.01)
C08K 5/06 (2006.01)
C08K 5/357 (2006.01)
C08K 5/5397 (2006.01)
H05K 1/02 (2006.01)

(52) U.S. Cl.
CPC ............ *C08K 5/357* (2013.01); *C08K 5/5397* (2013.01); *H05K 1/0209* (2013.01); *H05K 2201/06* (2013.01)

(58) Field of Classification Search
CPC ............ C08F 222/1006; C08F 222/102; C08F 290/147; C08K 5/053; C08K 5/06; C08K 5/14; C08K 5/357; C08K 5/5397; C08K 5/5415; C08L 2201/08; C08L 2203/206; C08L 51/08; C08L 61/00; C08L 71/02; C08L 91/06; C09K 5/06; H05K 1/0209; H05K 2201/06; Y02E 60/10
See application file for complete search history.

(56) References Cited

U.S. PATENT DOCUMENTS

| | | | | |
|---|---|---|---|---|
| 2013/0270476 A1* | 10/2013 | Yang | ............... | C09K 5/063 252/74 |
| 2015/0225576 A1* | 8/2015 | Aguirre Vargas | ..... | C08G 59/26 525/65 |
| 2016/0168439 A1* | 6/2016 | Ayambem | ............. | C09K 5/063 428/484.1 |

FOREIGN PATENT DOCUMENTS

| | | | |
|---|---|---|---|
| CN | 103178314 | A | 6/2013 |
| CN | 104263000 | A * | 1/2015 |
| CN | 105916350 | A | 8/2016 |
| CN | 107245887 | A1 | 10/2017 |
| CN | 107556963 | A | 1/2018 |
| CN | 108276854 | A | 7/2018 |
| CN | 111073525 | A | 4/2020 |
| JP | 2006063314 | A * | 3/2006 |
| JP | 5139203 | B2 | 2/2013 |

OTHER PUBLICATIONS

Dongguan NVT Technology Limited, Extended European Search Report, EP21165234.2, Sep. 24, 2021, 7 pgs.
Office Action, CN202010623183.8, Sep. 17, 2021, 14 pgs.
Examination Report, IN202114019919, Apr. 30, 2021, 5 pgs.
Office Action, CN202010623183.8, Apr. 16, 2021, 10 pgs.

* cited by examiner

COMPOSITE PHASE CHANGE MATERIAL, APPLICATION METHOD OF COMPOSITE PHASE CHANGE MATERIAL, AND BATTERY

CROSS-REFERENCE TO RELATED APPLICATIONS

This application is a continuation application of Chinese Patent Application No. 202010623183.8, filed with the State Intellectual Property Office of the People's Republic of China on Jun. 30, 2020, which is incorporated herein by reference in its entirety.

TECHNICAL FIELD

This application relates to the heat dissipation field, and in particular, to a composite phase change material, an application method of the composite phase change material, and a battery to which the composite phase change material is applied.

BACKGROUND

As the charge and discharge power of batteries is increasing with the improvement of functions and power of mobile terminals, especially after fast charge technologies are widely applied to the mobile terminals, increasing heat is generated in the batteries, especially in system control components in the batteries. As a result, overall temperature of the batteries sharply rises. This not only affects performance and safety of the batteries but even causes heat to be conducted to the mobile terminals, bringing adverse effects such as degradation of overall performance of the mobile terminals and overheating of their housings. Therefore, how to effectively dissipate heat for the batteries becomes a problem that urgently needs to be resolved.

SUMMARY

In view of this, it is essential to provide a composite phase change material to improve heat dissipation performance.

This application provides a composite phase change material, comprising: 65 to 80 parts of a phase change material by weight; and 20 to 35 parts of a binder by weight, wherein the binder includes an acrylate monomer having a molecular weight of 50 to 300, an acrylate polymer having a molecular weight of 500 to 2000, and an initiator.

In some embodiments, the acrylate monomer is 32 to 49 parts by weight, the acrylate polymer is 48 to 62 parts by weight, and the initiator is 3 to 10 parts by weight in the binder.

In some embodiments, the acrylate monomer includes one or more of ethyl acrylate, butyl acrylate, tetrahydrofuran acrylate, hydroxyethyl acrylate or isooctyl acrylate, dipentaerythritol hexaacrylate, isobornyl methacrylate, triethylene glycol dimethacrylate, 1,9-nonanediol diacrylate, 6-[(4'-cyano-4-biphenyl)oxy]hexyl methacrylate, and methacrylate phosphate; and the acrylate polymer includes one or more of methoxy polyethylene glycol acrylate, polyethylene glycol diacrylate, aliphatic urethane acrylate, urethane acrylate, and modified polyester acrylate.

In some embodiments, the initiator includes one or more of 2-hydroxy-2-methyl-1-phenylacetone, 2,4,6-trimethylbenzoyl-diphenylphosphine oxide, 1-hydroxycyclohexyl phenyl ketone, 2-methyl-2-(4-morpholinyl)-1-[4-(methylthio)phenyl]-1-acetone, ethyl(2,4,6-trimethylbenzoyl) phenylphosphinate, 2-dimethylamino-2-benzyl-1-[4-(4-morpholinyl)phenyl]-1-butanone, -2-hydroxy-2-methyl-1-[4-(2-hydroxyethoxy)phenyl]-1-acetone, 2,4-dihydroxybenzophenone, diaryliodonium salt, triphenyl sulfonium hexafluoroantimonate, and cumene ferrocene hexafluorophosphate.

In some embodiments, the binder further includes 0.5 to 1 part by weight of stabilizer.

In some embodiments, the stabilizer includes one or more of hydroquinone, p-methoxyphenol, p-benzoquinone, 2,6-di-tert-butylcresol, phenothiazine, and anthraquinone.

In some embodiments, each phase change material has a core-shell structure, including a shell and a core wrapped in the shell, the shell being a mixture of polyphenolic resin and polyethylene glycol and the core being modified paraffin wax, where a molecular weight of the polyphenolic resin is 30000 to 60000, a molecular weight of the polyethylene glycol is 4000 to 12000, and the polyphenoloxy resin and polyethylene glycol are mixed in a mass ratio of 1:7 to 1:3.

In some embodiments, the composite phase change material is sheet-shaped, rod-shaped, or granular.

This application further provides an method of applying the composite phase change material, the composite phase change material being applied to a battery, where the battery includes a battery core and a circuit board electrically connected to the battery core, and the method includes the following steps: arranging the composite phase change material on the circuit board; hot-melting the composite phase change material, so that the composite phase change material is in a fluid state; and irradiating the hot-melted composite phase change material with ultraviolet light, so that the composite phase change material is cured on the circuit board.

In some embodiments, the composite phase change material is hot-melted at a temperature of 70° C. to 110° C. for a time of 5 seconds to 90 seconds.

In some embodiments, in the process of irradiating the hot-melted composite phase change material with ultraviolet light, power of the ultraviolet light is 5 W to 100 W, a wavelength of the ultraviolet light is 254 nm to 420 nm, and an irradiation time is 5 seconds to 30 seconds.

This application further provides a battery that includes the composite phase change material.

In some embodiments, the battery includes a battery core and a circuit board electrically connected to the battery core, where the composite phase change material is arranged on the circuit board.

In this application, the binder combines with the phase change material, and the thus prepared composite phase change material can be directly connected to a circuit board without any additional auxiliary tools (for example, a glue), effectively reducing preparation costs of a battery. In addition, the composite phase change material has an advantage of good thermal fluidity. Therefore, when the composite phase change material is applied to a circuit board, the composite phase change material is in full contact with the circuit board, increasing a distribution area of the composite phase change material, which in turn improves the heat dissipation efficiency of the battery. In addition, the initiator in the composite phase change material can generate free radicals under the condition of ultraviolet light irradiation to initiate polymerization reactions between components of the composite phase change material, so that the composite phase change material is cured, thereby greatly accelerating a cure speed of the composite phase change material. In addition, after being cured, the composite phase change material does not flow when heated, providing good reliability.

REFERENCE SIGNS OF MAIN COMPONENTS

| battery | 100 |
| composite phase change material | 10 |
| battery core | 20 |
| packaging bag | 21 |
| body portion | 211 |
| top face | 2111 |
| top sealing portion | 212 |
| circuit board | 30 |

This application will be further described with reference to the accompanying drawings in the following specific embodiments.

DESCRIPTION OF EMBODIMENTS

The following clearly describes the technical solutions in the embodiments of this application with reference to the accompanying drawings in the embodiments of this application. Apparently, the described embodiments are merely some but not all of the embodiments of this application.

Unless otherwise defined, all technical and scientific terms used herein shall have the same meanings as commonly understood by those skilled in the art to which this application belongs. The terms used herein in the specification of this application are only used to describe specific embodiments, and are not intended to limit this application.

The following describes in detail some embodiments of this application with reference to the accompanying drawings. In absence of conflicts, the following embodiments and features in the embodiments may be combined.

An embodiment of this application discloses a composite phase change material, which includes 65 to 80 parts of phase change material and 20 to 35 parts of binder by weight.

In this application, the binder combines with the phase change material, and the thus prepared composite phase change material can be directly connected to a circuit board 30 without any additional auxiliary tools (for example, a glue), effectively reducing preparation costs of a battery 100.

In an embodiment, the composite phase change material may be sheet-shaped, rod-shaped, or granular.

Each phase change material has a core-shell structure, including a shell and a core wrapped in the shell. In this embodiment, a mass ratio of the shell to the core is 4:1 to 6:1. The shell is a mixture of polyphenolic resin and polyethylene glycol, and the core is modified paraffin wax. A molecular weight of the polyphenolic resin is 30000 to 60000, a molecular weight of the polyethylene glycol is 4000 to 12000, and the polyphenoloxy resin and polyethylene glycol are mixed in a mass ratio of 1:7 to 1:3.

The modified paraffin wax is prepared by modifying unmodified paraffin wax with a silane coupling agent, surfactant, and long-chain alkylamine or long-chain alkyl carboxylic acid. The unmodified paraffin wax may be but is not limited to at least one of n-tetradecane, n-pentadecane, n-hexadecane, and n-octadecane. A weight of the long-chain alkylamine or the long-chain alkyl carboxylic acid is 8% to 27% of a weight of the unmodified paraffin wax. A weight of the silane coupling agent is 0.5% to 1.3% of the weight of the unmodified paraffin wax. In some embodiments, a weight of the silane coupling agent is 0.7% to 1.3% of the weight of the unmodified paraffin wax.

The unmodified paraffin wax is modified by using the silane coupling agent, the surfactant, and the long-chain alkylamine or the long-chain alkyl carboxylic acid, to improve compatibility between the unmodified paraffin wax and another component in the composite phase change material, thereby preventing the paraffin wax from being separated from the composite phase change material.

The silane coupling agent is at least one of allyltrimethoxysilane, vinyltrimethoxysilane, allyltriethoxysilane, and vinyltriethoxysilane.

The surfactant is at least one of palmitic acid, oleic acid, linoleic acid, stearic acid, palmitic acid, octadecanone, 3-hexadecanone, 3-methylcyclotridecanone, coconut aldehyde, cyclotetradecanone, palmitaldehyde, eicosanal, alkyl (C12-C14) glycidyl ether, hexaethylene glycol monohexadecyl ether, tetraethylene glycol monotetradecyl ether, polyoxyethylene octyl phenol ether, and hexaethylene glycol monotetradecyl ether.

The long-chain alkylamine is at least one of n-dodecylamine, n-tetradecylamine, n-hexadecylamine and n-octadecylamine.

The long-chain alkyl carboxylic acid is at least one of palmitic acid, oleic acid, stearic acid, palmitic acid, and linoleic acid.

The binder includes acrylate monomer with a molecular weight of 50 to 300, an acrylate polymer with a molecular weight of 500 to 2000, and an initiator. By weight, there are 32 to 49 parts of acrylate monomer, 48 to 62 parts of acrylate polymer, and 3 to 10 parts of initiator in the binder.

The acrylate monomer includes one or more of ethyl acrylate, butyl acrylate, tetrahydrofuran acrylate, hydroxyethyl acrylate, isooctyl acrylate, dipentaerythritol hexaacrylate, isobornyl methacrylate, triethylene glycol dimethacrylate, 1,9-nonanediol diacrylate, 6-[(4'-cyano-4-biphenyl)oxy]hexyl methacrylate, and methacrylate phosphate.

The acrylate polymer includes one or more of methoxy polyethylene glycol acrylate, polyethylene glycol diacrylate, aliphatic urethane acrylate, urethane acrylate, and modified polyester acrylate.

The initiator includes one or more of 2-hydroxy-2-methyl-1-phenylacetone, 2,4,6-trimethylbenzoyl-diphenylphosphine oxide, 1-hydroxycyclohexyl phenyl ketone, 2-methyl-2-(4-morpholinyl)-1-[4-(methylthio)phenyl]-1-acetone, ethyl(2,4,6-trimethylbenzoyl) phenylphosphinate, 2-dimethylamino-2-benzyl-1-[4-(4-morpholinyl)phenyl]-1-butanone, -2-hydroxy-2-methyl-1-[4-(2-hydroxyethoxy)phenyl]-1-acetone, 2,4-dihydroxybenzophenone, diaryliodonium salt, triphenyl sulfonium hexafluoroantimonate, and cumene ferrocene hexafluorophosphate.

Further, the binder also includes a stabilizer. The binder further includes 0.5 to 1 part by weight of stabilizer.

The stabilizer includes one or more of hydroquinone, p-methoxyphenol, p-benzoquinone, 2,6-di-tert-butylcresol, phenothiazine, and anthraquinone.

The stabilizer can prevent polymerization between components in the binder during storage of the binder, increasing stability of the binder and stability of the composite phase change material.

This application also provides a method for preparing the foregoing composite phase change material, and the method includes the following steps:

The phase change material and the binder are mixed evenly in specified parts by weight under a condition of 80° C. to 120° C.

Specifically, in this embodiment, the phase change material and the binder may be mixed in specified parts by weight under the condition of 80° C. to 120° C. for 30 minutes to 50 minutes by using an open mill until the phase change material and the binder are evenly mixed.

The evenly mixed phase change material and binder are extruded from an extruder under the condition of 80° C. to 120° C. to form the composite phase change material. The extruder is a twin screw extruder.

In some embodiments, the composite phase change material may be sheet-shaped. In this case, the method for preparing the composite phase change material further includes a step of compressing the composite phase change material extruded by the extruder to form a sheet-shaped composite phase change material. A thickness of the sheet-shaped composite phase change material is 0.2 mm to 2.0 mm.

In some embodiments, the composite phase change material may be rod-shaped. In this case, the evenly mixed phase change material and binder need to be extruded from a circular extrusion hole at an extrusion nozzle of the extruder under the condition of 80° C. to 120° C., and then cooled down to obtain a rod-shaped composite phase change material. A diameter of the rod-shaped composite phase change material is 5 mm to 12 mm.

Further, the method for preparing the composite phase change material also includes a step of cutting the rod-shaped composite phase change material into granules by using a pelletizer, to prepare a granular composite phase change material.

Figure 1:
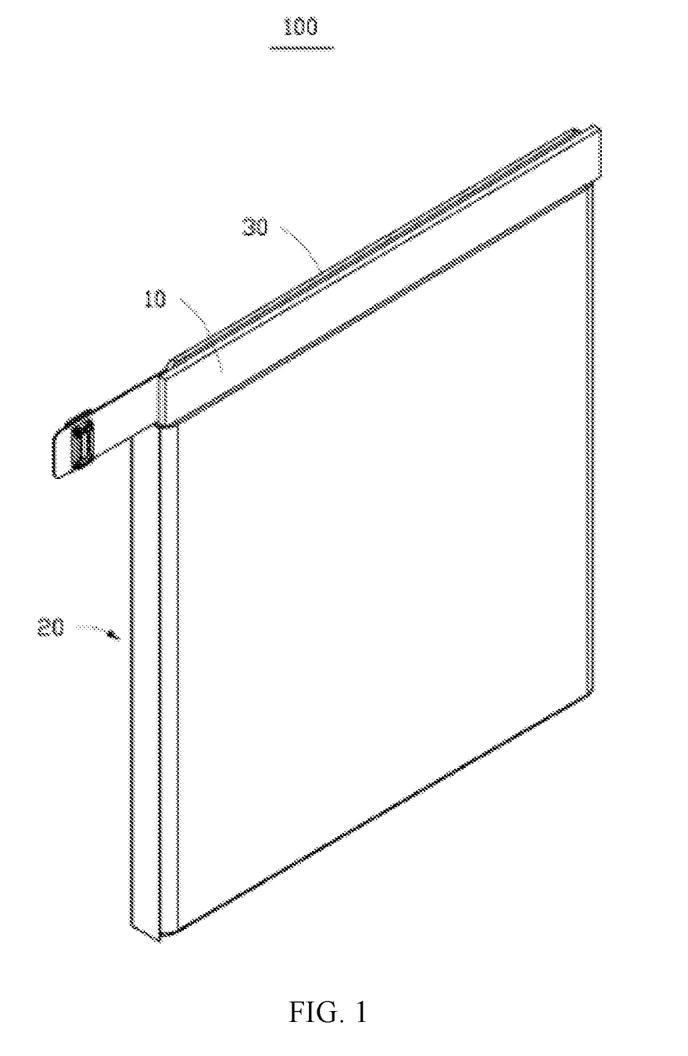
FIG. 1 is a schematic structural diagram of a battery according to an embodiment of this application.
Figure 2:
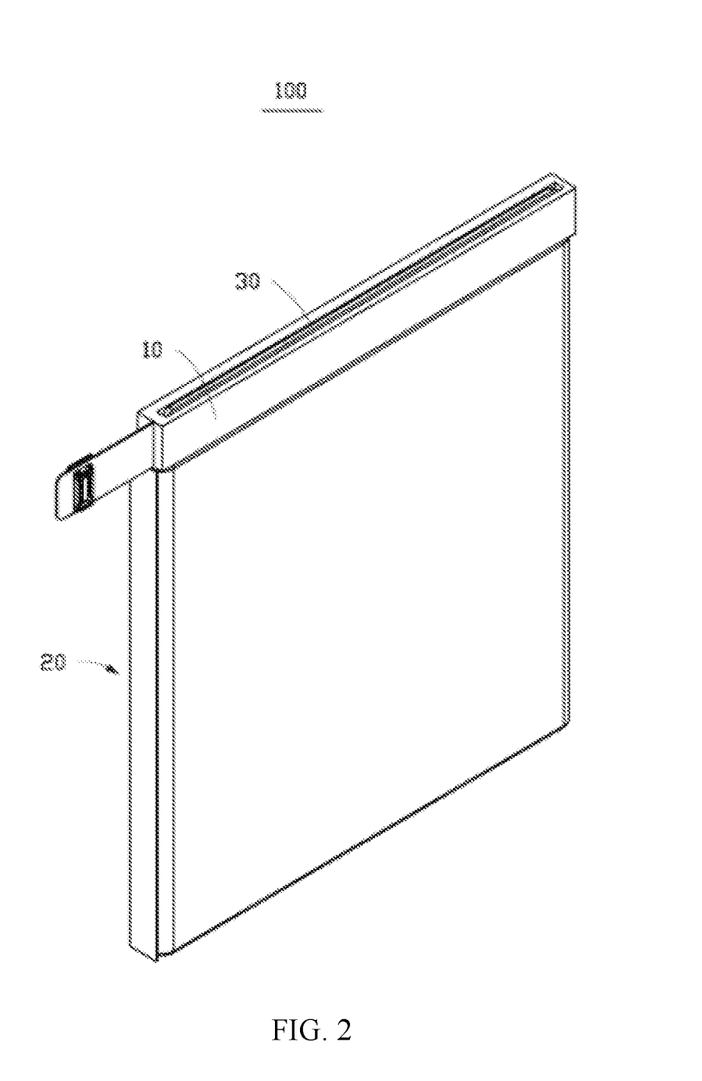
FIG. 2 is a schematic structural diagram of a battery according to another embodiment of this application.
Figure 3:
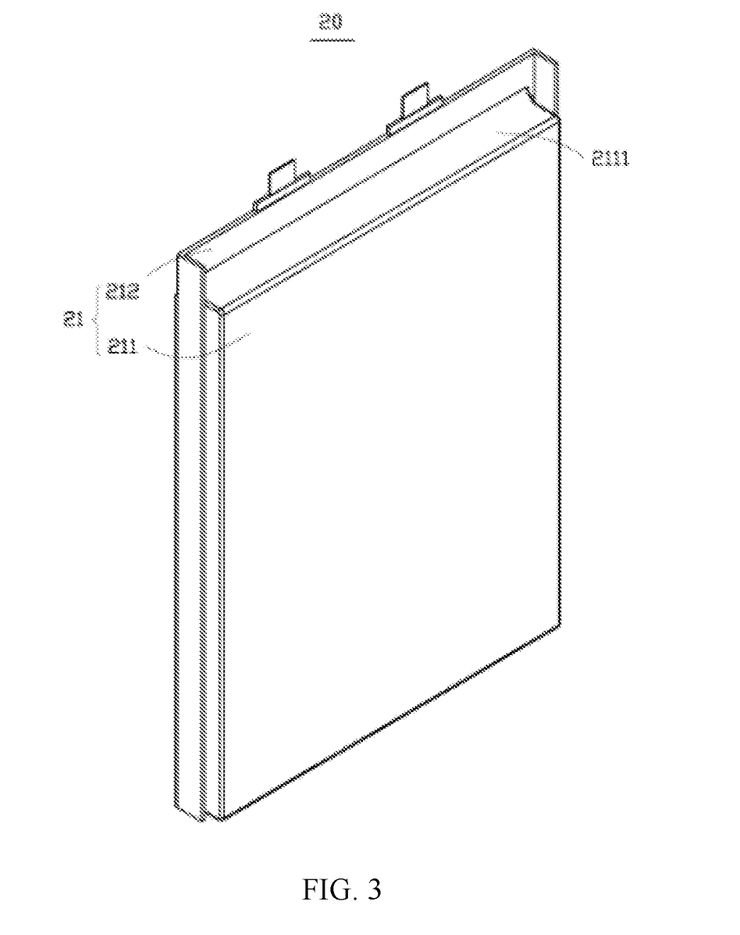
FIG. 3 is a schematic structural diagram of a battery core shown in FIG. 1.

This application further provides an application method of the foregoing composite phase change material 10. Referring to FIG. 1 and FIG. 2, the composite phase change material 10 may be applied to a battery 100. Referring to FIG. 3, the battery 100 includes a battery core 20 and a circuit board 30 electrically connected to the battery core 20. In some embodiments, the battery cell 20 is a soft-package battery core, and includes a packaging bag 21. The packaging bag 21 includes a body portion 211 and a top sealing portion 212. The body portion 211 includes a top face 2111. The top sealing portion 212 extends from the top face 2111. The circuit board 30 is vertically placed on the top face 2111 and is opposite the top sealing portion 212. The battery core 20 further includes an electrode assembly, an electrolyte, and the like. The battery core 20 may be a soft-package battery core in the prior art, and is not further described herein. Certainly, the battery core 20 is not limited to a soft-package battery core, but may alternatively be a battery core with a metal shell or the like.

The application method of the composite phase change material 10 includes the following steps:

Referring to FIG. 1, the composite phase change material 10 is arranged on the circuit board 30. The sheet-shaped, rod-shaped, or granular composite phase change material 10 may be selected based on an actual need. In this embodiment, the sheet-shaped composite phase change material 10 is selected and arranged on a surface of the circuit board 30 that faces away from the top sealing portion 212.

The composite phase change material 10 is hot-melted, so that the composite phase change material 10 is in a fluid state. In this way, the fluid composite phase change material 10 can be in full contact with the surface of the circuit board 30. In some embodiments, the fluid composite phase change material 10 can further fill a gap between the circuit board 30 and the top sealing portion 212. In this way, a distribution area of the composite phase change material 10 on the circuit board 30 is increased, heat dissipation performance is improved, and connection between the circuit board 30 and the top sealing portion 212 is enhanced. The composite phase change material 10 is hot-melted at a temperature of 70° C. to 110° C. for a time of 5 seconds to 90 seconds. In some embodiments, the composite phase change material 10 is hot-melted at a temperature of 80° C.

A hot sealing process may be used to hot-melt the sheet-shaped composite phase change material 10. A hot-melt glue gun may be used to hot-melt the rod-shaped composite phase change material 10. A dispenser may be used to hot-melt the granular composite phase change material 10.

In some embodiments, the fluid composite phase change material 10 may further be filled into the gap between the circuit board 30 and the top sealing portion 212, to encompass the surface of the circuit board 30 (refer to FIG. 2).

The hot-melted composite phase change material 10 is irradiated with ultraviolet light, so that the composite phase change material 10 is cured and directly connected to the circuit board 30. In the process of irradiating the hot-melted composite phase change material 10 with ultraviolet light, power of the ultraviolet light is 5 W to 100 W, a wavelength of the ultraviolet light is 254 nm to 420 nm, and an irradiation time is 5 seconds to 30 seconds. In some embodiments, in the process of irradiating the hot-melted composite phase change material 10 with ultraviolet light, power of the ultraviolet light is 60 W, a wavelength of the ultraviolet light is 365 nm, and an irradiation time is 20 seconds. In some other embodiments, an irradiation time is 10 seconds to 30 seconds.

The initiator in the composite phase change material in this application can generate free radicals under the condition of ultraviolet light irradiation to initiate polymerization reactions between components of the composite phase change material, so that the composite phase change material 10 is cured, thereby greatly accelerating a cure speed of the composite phase change material. In addition, after being cured, the composite phase change material does not flow when heated, providing good reliability.

This application further provides a battery 100, including the battery core 20, the circuit board 30 electrically connected to the battery core 20, and the composite phase change material 10. The composite phase change material 10 is arranged on the circuit board 30.

In some embodiments, the battery cell 20 is a soft-package battery core, and includes a packaging bag 21. The packaging bag 21 includes a body portion 211 and a top sealing portion 212. The body portion 211 includes a top face 2111. The top sealing portion 212 extends from the top face 2111. The circuit board 30 is vertically placed on the top face 2111 and is opposite the top sealing portion 212. The battery core 20 further includes an electrode assembly, an electrolyte, and the like. The battery core 20 is a soft-package battery core in the prior art, and is not further described herein. Certainly, the battery core 20 is not limited to a soft-package battery core, but may alternatively be a battery core with a metal shell or the like.

In some embodiments, the composite phase change material 10 is arranged on a surface of the circuit board 30 that faces away from the top sealing portion.

In some other embodiments, the composite phase change material 10 is located on the top face 2111 and is arranged around the circuit board 30. That is, the composite phase change material 10 is arranged on the surface of the circuit board 30 that faces away from the top sealing portion, and between the circuit board 30 and the top sealing portion 212.

The following provides further descriptions by using examples and comparative examples.

Example 1

A composite phase change material includes 70 parts of phase change material and 30 parts of binder by weight.

In Example 1, the composite phase change material may be prepared in the following method.

Preparation of the phase change material: Unmodified paraffin wax was hot-melted, then long-chain alkylamine, a silane coupling agent, and surfactant were added into the hot-melted unmodified paraffin wax, and were incubated in a water bath or an oil bath for two hours after being mixed. A weight of the added long-chain alkylamine was 8% of a weight of the unmodified paraffin wax, a weight of the added silane coupling agent was 0.5% of the weight of the unmodified paraffin wax, and a weight of the added surfactant was 0.3% of the weight of the unmodified paraffin wax. The long-chain alkylamine was n-dodecylamine, the silane coupling agent was vinyltrimethoxysilane, and the surfactant was palmitic acid. Then polyphenolic resin of phenoxy resin PKHB (with a molecular weight of 32000) from Gabriel in U.S.A. and polyethylene glycol, that is, PEG-6000 (with a molecular weight of 6000) from Clariant, were added separately in turn in a mass ratio of 1:3, and were stirred at a speed of 1000 revolutions per minute for 10 minutes, where a total weight of the polyphenolic resin and the polyethylene glycol was 30% of a total weight of the unmodified paraffin wax and the long-chain alkylamine. Then, the resulting mixture was cooled to 50° C. and then vibrated with a vibrating screen for more than 4 hours, to prepare the phase change material.

Preparation of the binder: Aliphatic urethane acrylate (provided by Wraio Chemicals) was added under nitrogen protection, and stirred continuously where temperature was controlled to be below 75° C.; then hydroxyethyl acrylate and isooctyl acrylate were added sequentially, and then 2-dimethylamino-2-benzyl-1-[4-(4-morpholinyl)phenyl]-1-butanone was added; then heating was stopped, hydroquinone was added during stirring, and when cooled down to room temperature, the resulting mixture was stored in a sealed container and protected from light. The binder was thus obtained. By weight, there were 60 parts of aliphatic urethane acrylate, 17 parts of hydroxyethyl acrylate, 18 parts of isooctyl acrylate, 4 parts of 2-dimethylamino-2-benzyl-1-[4-(4-morpholinyl)phenyl]-1-butanone, and 1 part of hydroquinone in the binder.

Preparation of the composite phase change material: 70 parts by weight of phase change material were added into 30 parts by weight of binder, and they were mixed for 30 minutes at 95° C. by using an open mill until evenly mixed; and then the evenly mixed phase change material and binder were put into a twin screw extruder, extruded at 105° C., and then compressed into a sheet-shaped composite phase change material of a thickness of 0.5 mm.

Example 2

A composite phase change material includes 75 parts of phase change material and 25 parts of binder by weight.

In Example 2, the composite phase change material may be prepared in the following method.

Preparation of the phase change material: Unmodified paraffin wax was hot-melted, then long-chain alkylamine, a silane coupling agent, and surfactant were added into the hot-melted unmodified paraffin wax, and were incubated in a water bath or an oil bath for two hours after being mixed. A weight of the added long-chain alkylamine was 27% of a weight of the unmodified paraffin wax, a weight of the added silane coupling agent was 0.5% of the weight of the unmodified paraffin wax, and a weight of the added surfactant was 0.3% of the weight of the unmodified paraffin wax. The long-chain alkylamine was n-hexadecylamine, the silane coupling agent was Vinyl propyl trimethoxysilane, and the surfactant was hexaethylene glycol monohexadecyl ether. Then polyphenolic resin of phenoxy resin PKHB (with a molecular weight of 59000) from Gabriel in U.S.A. and polyethylene glycol, that is, PEG-12000 (with a molecular weight of 12000) from Clariant, were added separately in turn in a mass ratio of 1:6, and were stirred at a speed of 1200 revolutions per minute for 15 minutes, where a total weight of the polyphenolic resin and the polyethylene glycol was 25% of a total weight of the unmodified paraffin wax and the long-chain alkylamine. Then, the resulting mixture was cooled to 50° C. and then vibrated with a vibrating screen for more than 4 hours, to prepare the phase change material.

Preparation of the binder: RJ4236 aliphatic urethane acrylate (provided by RYOJI) and RJ427 aliphatic urethane acrylate (provided by RYOJI) were added under nitrogen protection, and stirred continuous where temperature was controlled to be within 75° C.; then triethylene glycol dimethacrylate and isobornyl methacrylate were added sequentially, and then 2-methyl-2-(4-morpholinyl)-1-[4-(methylthio)phenyl]-1-acetone was added; then heating was stopped, hydroquinone was added during stirring, and when cooled down to room temperature, the resulting mixture was stored in a sealed container and protected from light. The binder was thus obtained. By weight, there were 27.5 parts of RJ4236 aliphatic urethane acrylate, 27.5 parts of RJ427 aliphatic urethane acrylate, 20 parts of triethylene glycol dimethacrylate, 20 parts of isobornyl methacrylate, 4 parts of 2-methyl-2-(4-morpholinyl)-1-[4-(methylthio)phenyl]-1-acetone, and 1 part of hydroquinone.

Preparation of the composite phase change material: 75 parts by weight of phase change material were added into 25 parts by weight of binder, and they were mixed for 30 minutes at 95° C. by using an open mill until evenly mixed; and then the evenly mixed phase change material and binder were put into a twin screw extruder, extruded at 105° C., and then compressed into a sheet-shaped composite phase change material of a thickness of 1.0 mm.

Example 3

A composite phase change material includes 65 parts of phase change material and 35 parts of binder by weight.

In Example 3, the composite phase change material may be prepared in the following method.

Preparation of the phase change material: Unmodified paraffin wax was hot-melted, then long-chain alkylamine, a silane coupling agent, and surfactant were added into the hot-melted unmodified paraffin wax, and were incubated in a water bath or an oil bath for two hours after being mixed. A weight of the added long-chain alkylamine was 8% of a weight of the unmodified paraffin wax, a weight of the added silane coupling agent was 0.5% of the weight of the unmodified paraffin wax, and a weight of the added surfactant was 0.3% of the weight of the unmodified paraffin wax. The long-chain alkylamine was n-dodecylamine, the silane coupling agent was propyl trimethoxysilane, and the surfactant was palmitic acid. Then polyphenolic resin of phenoxy resin PKHB (with a molecular weight of 32000) from Gabriel in U.S.A. and polyethylene glycol, that is, PEG-6000 (with a molecular weight of 6000) from Clariant, were added separately in turn in a mass ratio of 1:3, and were stirred at a speed of 1000 revolutions per minute for 10 minutes, where a total weight of the polyphenolic resin and the polyethylene glycol was 35% of a total weight of the unmodified paraffin wax and the long-chain alkylamine. Then, the resulting mixture was cooled to 50° C. and then vibrated with a vibrating screen for more than 4 hours, to prepare the phase change material.

Preparation of the binder: PEG600DA polyethylene glycol diacrylate (provided by RYOJI) and RJ426 aliphatic urethane acrylate (provided by RYOJI) were added under nitrogen protection, and stirred continuously where temperature was controlled to be within 75° C.; then tetrahydrofuran acrylate, dipentaerythritol hexaacrylate, and isooctyl acrylate were added sequentially, and then 2,4,6-trimethylbenzoyl-diphenylphosphine oxide was added; then heating was stopped, p-methoxyphenol was added during stirring, and when cooled down to room temperature, the resulting mixture was stored in a sealed container and protected from light. The binder was thus obtained. By weight, there were 45 parts of PEG600DA polyethylene glycol diacrylate, 15 parts of RJ426 aliphatic urethane acrylate, 15 parts of tetrahydrofuran acrylate, 10 parts of dipentaerythritol hexaacrylate, 10 parts of isooctyl acrylate, 4 parts of 2,4,6-trimethylbenzoyl-diphenylphosphine oxide, and 1 part of p-methoxyphenol.

Preparation of the composite phase change material: 65 parts by weight of phase change material were added into 35 parts by weight of binder, and they were mixed for 30 minutes at 95° C. by using an open mill until evenly mixed; and then the evenly mixed phase change material and binder were put into a twin screw extruder, extruded from a circular extrusion hole at the head of an extruder at 105° C., and cooled down, to obtain a rod-shaped composite phase change material of a diameter of 5 mm to 12 mm.

Example 4

A composite phase change material includes 65 parts of phase change material and 35 parts of binder by weight.

In Example 4, the composite phase change material may be prepared in the following method.

Preparation of the phase change material: Unmodified paraffin wax was hot-melted, then long-chain alkylamine, a silane coupling agent, and surfactant were added into the hot-melted unmodified paraffin wax, and were incubated in a water bath or an oil bath for two hours after being mixed. A weight of the added long-chain alkylamine was 8% of a weight of the unmodified paraffin wax, a weight of the added silane coupling agent was 0.5% of the weight of the unmodified paraffin wax, and a weight of the added surfactant was 0.3% of the weight of the unmodified paraffin wax. The long-chain alkylamine was n-dodecylamine, the silane coupling agent was propyl trimethoxysilane, and the surfactant was hexaethylene glycol monohexadecyl ether. Then, polyphenolic resin of phenoxy resin PKHB (with a molecular weight of 32000) from Gabriel in U.S.A. and polyethylene glycol, that is, PEG-6000 (with a molecular weight of 6000) from Clariant, were added separately in turn in a mass ratio of 1:3, and were stirred at a speed of 1000 revolutions per minute for 10 minutes, where a total weight of the polyphenolic resin and the polyethylene glycol was 35% of a total weight of the unmodified paraffin wax and the long-chain alkylamine. Then, the resulting mixture was cooled to 50° C. and then vibrated with a vibrating screen for more than 4 hours, to prepare the phase change material.

Preparation of the binder: PEG600DA polyethylene glycol diacrylate (provided by RYOJI) and modified polyester acrylate (provided by Wraio Chemicals) were added under nitrogen protection, and stirred continuously where temperature was controlled to be within 75° C.; then tetrahydrofuran acrylate and hydroxyethyl acrylate were added sequentially, and then 2,4,6-trimethylbenzoyl-diphenylphosphine oxide was added; then heating was stopped, p-methoxyphenol was added during stirring, and when cooled down to room temperature, the resulting mixture was stored in a sealed container and protected from light. The binder was thus obtained. By weight, there were 20 parts of PEG600DA polyethylene glycol diacrylate, 40 parts of modified polyester acrylate, 25 parts of tetrahydrofuran acrylate, 10 parts of hydroxyethyl acrylate, 4 parts of 2,4,6-trimethylbenzoyl-diphenylphosphine oxide, and 1 part of p-methoxyphenol.

Preparation of the composite phase change material: 65 parts by weight of phase change material were added into 35 parts by weight of binder, and they were mixed for 30 minutes at 100° C. by using an open mill until evenly mixed; and then the evenly mixed phase change material and binder were put into a twin screw extruder, extruded from a circular extrusion hole at the head of an extruder at 105° C., and cooled down, to obtain a rod-shaped composite phase change material. Finally, the rod-shaped composite phase change material was cut into granules by using a pelletizer, to prepare a granular composite phase change material.

Next, the composite phase change materials prepared in Examples 1 to 4 were placed on the circuit board 30 of the battery 100 separately, and hot-melted, to make the composite phase change materials come into full contact with the circuit board 30; and the composite phase change materials were then cured by irradiating with ultraviolet light for 30 seconds, so that the composite phase change materials 10 were directly connected to the circuit board 30 (refer to FIG. 1). Four batteries provided with the composite phase change materials in Examples 1 to 4 were used as samples 1 to 4 respectively, and a battery without any heat dissipation material was used as a blank sample. In addition, Bergquist Hi-flow 625 was further provided as a comparative phase change material and was attached to the circuit board on the battery (through a glue, for example, a double-sided tape), to serve as comparative samples 1 to 4.

Specifically, in a laboratory room at room temperature of 23±2° C., the foregoing samples 1 to 4, blank sample, and comparative samples 1 to 4 were placed into boxes of a same size respectively, to reduce impact of external environment on room temperature around the battery. The samples 1 to 4, the blank sample, and the comparative samples 1 to 4 were charged and discharged. In the test process, highest temperature $T_1$ of a thermistor (PTC) on a circuit board of each battery and temperature at a distance of 20 cm from the battery outside the box at that time that was used as the room temperature were recorded in Table 1 below; and in the test process, highest temperature $T_2$ of a MOS on the circuit board of each battery and temperature at a distance of 20 cm from the battery outside the box at that time that was used as the room temperature were recorded in Table 2 below. Temperature rise $\Delta T_1$ of a component is obtained by subtracting the room temperature from the highest temperature (that is, $T_1$ or $T_2$) of the component. Temperature drop $\Delta T_2$ of a component is obtained by subtracting $\Delta T_1$ (any one of the samples 1 to 4 and the comparative samples 1 to 4) from $\Delta T_1$ (the blank sample).

TABLE 1

| | Material thickness (mm) | $T_1$ (° C.) | Room temperature (° C.) | $\Delta T_1$ (° C.) | $\Delta T_2$ (° C.) |
|---|---|---|---|---|---|
| Blank sample | / | 57.35 | 24.23 | 33.12 | 0.00 |
| Comparative sample 1 | 0.50 | 53.98 | 24.32 | 29.66 | 3.46 |
| Sample 1 | 0.50 | 52.58 | 24.02 | 28.56 | 4.56 |
| Comparative sample 2 | 1.00 | 53.97 | 24.33 | 29.64 | 3.48 |
| Sample 2 | 1.00 | 50.47 | 24.28 | 26.19 | 6.93 |
| Comparative sample 3 | 1.50 | 51.91 | 24.35 | 27.56 | 5.56 |
| Sample 3 | 1.50 | 49.69 | 24.02 | 25.67 | 7.45 |
| Comparative sample 4 | 2.00 | 51.81 | 24.68 | 27.13 | 5.99 |
| Sample 4 | 2.00 | 48.87 | 23.98 | 24.89 | 8.23 |

TABLE 2

| | Material thickness (mm) | $T_2$ (° C.) | Room temperature (° C.) | $\Delta T_1$ (° C.) | $\Delta T_2$ (° C.) |
|---|---|---|---|---|---|
| Blank sample | / | 59.08 | 24.64 | 34.44 | 0.00 |
| Comparative sample 1 | 0.50 | 54.52 | 24.78 | 29.74 | 4.70 |
| Sample 1 | 0.50 | 52.11 | 24.76 | 27.35 | 7.09 |
| Comparative sample 2 | 1.00 | 53.44 | 24.55 | 28.89 | 5.55 |
| Sample 2 | 1.00 | 50.03 | 24.36 | 25.67 | 8.77 |
| Comparative sample 3 | 1.50 | 51.68 | 23.83 | 27.85 | 6.59 |
| Sample 3 | 1.50 | 50.48 | 24.45 | 26.03 | 8.41 |
| Comparative sample 4 | 2.00 | 51.63 | 24.53 | 27.10 | 7.34 |
| Sample 4 | 2.00 | 50.4 | 25.34 | 25.06 | 9.38 |

In this application, the binder combines with the phase change material, and the thus prepared composite phase change material has an advantage of good thermal fluidity. Therefore, when the composite phase change material is applied to, for example, the circuit board 30 in this application, the composite phase change material is in full contact with the circuit board 30, increasing the distribution area of the composite phase change material, which in turn improves heat dissipation efficiency of the battery 100. In addition, with reference to Table 1 and Table 2, it can be learned that the composite phase change material absorbs, through a phase change characteristic, heat generated by components (for example, PTC thermistors and MOSs) on the circuit board 30 in the charge and discharge process of the battery 100. In addition, in comparison with conventional materials, the temperature rise $\Delta T_1$ of the circuit board 30 is 1° C. to 4° C. lower, and the temperature drop $\Delta T_2$ of the circuit board 30 is 3° C. to 4° C. higher.

The foregoing embodiments are merely intended to describe the technical solutions of this application, but not intended to constitute any limitation. Although this application is described in detail with reference to embodiments, persons of ordinary skill in the art should understand that modifications or equivalent replacements can be made to the technical solutions of this application, without departing from the spirit and essence of the technical solutions of this application.

What is claimed is:

1. A composite phase change material, comprising:
65 to 80 parts of a phase change material by weight; and
20 to 35 parts of a binder by weight;
wherein,
the binder comprises an acrylate monomer having a molecular weight of 50 to 300, an acrylate polymer having a molecular weight of 500 to 2000, and an initiator; and
the phase change material has a core-shell structure, comprising a shell and a core wrapped in the shell; the shell being a mixture of polyphenoloxy resin and polyethylene glycol; and the core being modified paraffin wax; wherein a molecular weight of the polyphenoloxy resin is 30000 to 60000, a molecular weight of the polyethylene glycol is 4000 to 12000; and the polyphenoloxy resin and the polyethylene glycol are mixed in a mass ratio of 1:7 to 1:3.

2. The composite phase change material according to claim 1, wherein the acrylate monomer is 32 to 49 parts by weight, the acrylate polymer is 48 to 62 parts by weight, and the initiator is 3 to 10 parts by weight in the binder.

3. The composite phase change material according to claim 1, wherein the acrylate monomer comprises one or more selected from the group consisting of ethyl acrylate, butyl acrylate, tetrahydrofuran acrylate, hydroxyethyl acrylate or isooctyl acrylate, dipentaerythritol hexaacrylate, isobornyl methacrylate, triethylene glycol dimethacrylate, 1,9-nonanediol diacrylate, 6-[(4'-cyano-4-biphenyl)oxy] hexyl methacrylate, and methacrylate phosphate; and the acrylate polymer comprises one or more selected from the group consisting of methoxy polyethylene glycol acrylate, polyethylene glycol diacrylate, aliphatic urethane acrylate, urethane acrylate, and modified polyester acrylate.

4. The composite phase change material according to claim 1, wherein the initiator comprises one or more selected from the group consisting of 2-hydroxy-2-methyl-1-phenylacetone, 2,4,6-trimethylbenzoyl-diphenylphosphine oxide, 1-hydroxycyclohexyl phenyl ketone, 2-methyl-2-(4-morpholinyl)-1-[4-(methylthio)phenyl]-1-acetone, ethyl(2,4,6-trimethylbenzoyl) phenylphosphinate, 2-dimethylamino-2-benzyl-1-[4-(4-morpholinyl)phenyl]-1-butanone, 2-hydroxy-2-methyl-1-[4-(2-hydroxyethoxy)phenyl]-1-acetone, 2,4-dihydroxybenzophenone, diaryliodonium salt, triphenyl sulfonium hexafluoroantimonate, and cumene ferrocene hexafluorophosphate.

5. The composite phase change material according to claim 1, wherein the binder further comprises 0.5 to 1 part by weight of stabilizer.

6. The composite phase change material according to claim 5, wherein the stabilizer comprises one or more selected from the group consisting of hydroquinone, p-methoxyphenol, p-benzoquinone, 2,6-di-tert-butylcresol, phenothiazine, and anthraquinone.

7. The composite phase change material according to claim 1, wherein the composite phase change material is sheet-shaped, rod-shaped, or granular.

8. A method of applying the composite phase change material of claim 1 to a battery, wherein the battery comprises a battery core and a circuit board electrically connected to the battery core, and the method comprises the following steps:
arranging the composite phase change material on the circuit board;
hot-melting the composite phase change material, so that the composite phase change material is in a fluid state; and irradiating the hot-melted composite phase change material with ultraviolet light, so that the composite phase change material is cured on the circuit board.

9. The method of claim 8, wherein the composite phase change material is hot-melted at a temperature of 70° °C. to 110°C for a time of 5 seconds to 90 seconds.

10. The method of claim 8, wherein in the process of irradiating the hot-melted composite phase change material with ultraviolet light, power of the ultraviolet light is 5 W to 100 W, a wavelength of the ultraviolet light is 254 nm to 420 nm, and an irradiation time is 5 seconds to 30 seconds.

11. A battery comprising the composite phase change material according to claim 1.

12. The battery according to claim 11, wherein the acrylate monomer is 32 to 49 parts by weight, the acrylate polymer is 48 to 62 parts by weight, and the initiator is 3 to 10 parts by weight in the binder.

13. The battery according to claim 11, wherein the acrylate monomer comprises one or more selected from the group consisting of ethyl acrylate, butyl acrylate, tetrahydrofuran acrylate, hydroxyethyl acrylate or isooctyl acrylate, dipentaerythritol hexaacrylate, isobornyl methacrylate, triethylene glycol dimethacrylate, 1,9-nonanediol diacrylate, 6-[(4'-cyano-4-biphenyl)oxy]hexyl methacrylate, and methacrylate phosphate; and the acrylate polymer comprises one or more selected from the group consisting of methoxy polyethylene glycol acrylate, polyethylene glycol diacrylate, aliphatic urethane acrylate, urethane acrylate, and modified polyester acrylate.

14. The battery according to claim 11, wherein the initiator comprises one or more selected from the group consisting of 2-hydroxy-2-methyl-1-phenylacetone, 2,4,6-trimethylbenzoyl-diphenylphosphine oxide, 1-hydroxycyclohexyl phenyl ketone, 2-methyl-2-(4-morpholinyl)-1-[4-(methylthio)phenyl]-1-acetone, ethyl(2,4,6-trimethylbenzoyl) phenylphosphinate, 2-dimethylamino-2-benzyl-1-[4-(4-morpholinyl)phenyl]-1-butanone, 2-hydroxy-2-methyl-1-[4-(2-hydroxyethoxy)phenyl]-1-acetone, 2,4-dihydroxybenzophenone, diaryliodonium salt, triphenyl sulfonium hexafluoroantimonate, and cumene ferrocene hexafluorophosphate.

15. The battery according to claim 11, wherein the binder further comprises 0.5 to 1 part by weight of stabilizer.

16. The battery according to claim 15, wherein the stabilizer comprises one or more selected from the group consisting of hydroquinone, p-methoxyphenol, p-benzoquinone, 2,6-di-tert-butylcresol, phenothiazine, and anthraquinone.

17. The battery according to claim 11, wherein the composite phase change material is sheet-shaped, rod-shaped, or granular.

18. The battery according to claim 11, wherein the battery further comprises a battery core and a circuit board electrically connected to the battery core, wherein the composite phase change material is arranged on the circuit board.

* * * * *